US011522155B2

(12) United States Patent
Yug et al.

(10) Patent No.: US 11,522,155 B2
(45) Date of Patent: Dec. 6, 2022

(54) DISPLAY DEVICE AND METHOD FOR MANUFACTURING THE SAME

(71) Applicant: SAMSUNG DISPLAY CO., LTD., Yongin-si (KR)

(72) Inventors: Geunwoo Yug, Seoul (KR); Taehyun Jung, Seoul (KR); Seoin Han, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 282 days.

(21) Appl. No.: 16/936,954

(22) Filed: Jul. 23, 2020

(65) Prior Publication Data

US 2021/0028391 A1 Jan. 28, 2021

(30) Foreign Application Priority Data

Jul. 25, 2019 (KR) .................. 10-2019-0090091

(51) Int. Cl.
| | | |
|---|---|---|
| *H01L 51/52* | (2006.01) | |
| *H01L 51/00* | (2006.01) | |
| *H01L 51/56* | (2006.01) | |
| *B23K 26/38* | (2014.01) | |
| *B23K 26/08* | (2014.01) | |
| *B23K 26/06* | (2014.01) | |
| *B23K 103/00* | (2006.01) | |

(52) U.S. Cl.
CPC ...... *H01L 51/5237* (2013.01); *B23K 26/0604* (2013.01); *B23K 26/08* (2013.01); *B23K 26/38* (2013.01); *H01L 51/0097* (2013.01); *H01L 51/56* (2013.01); *B23K 2103/56* (2018.08); *H01L 2251/5338* (2013.01); *H01L 2251/566* (2013.01)

(58) Field of Classification Search
CPC .............................................. H01L 2251/5338
See application file for complete search history.

(56) References Cited

U.S. PATENT DOCUMENTS

| | | | |
|---|---|---|---|
| 10,534,400 B2 * | 1/2020 | Wu | ..................... H04M 1/0214 |
| 2017/0157706 A1 | 6/2017 | Hirano et al. | |

FOREIGN PATENT DOCUMENTS

| | | |
|---|---|---|
| KR | 20150045076 | 4/2015 |
| KR | 20180109012 | 10/2018 |
| KR | 101962046 | 3/2019 |
| KR | 10-2020-0121948 | 10/2020 |

* cited by examiner

*Primary Examiner* — Vip Patel
(74) *Attorney, Agent, or Firm* — H.C. Park & Associates, PLC

(57) ABSTRACT

A method for manufacturing a display device including a display panel having a folding area to be folded along a virtual folding axis and first and second non-folding areas adjacent to both sides of the folding area, and a window disposed on the display panel, the method including preparing a mother substrate having an effective area and a non-effective area divided by a cutting line, performing a first laser process along a first cutting line disposed in the first non-folding area, performing a second laser process along a second cutting line disposed in the second non-folding area, and performing a third laser process along a third cutting line disposed in the folding area, in which one end of the third cutting line overlaps a first end of the first cutting line, and the other end of the third cutting line overlaps a first end of the second cutting line.

20 Claims, 16 Drawing Sheets

DISPLAY DEVICE AND METHOD FOR MANUFACTURING THE SAME

CROSS-REFERENCE TO RELATED APPLICATION

This application claims priority from and the benefit of Korean Patent Application No. 10-2019-0090091, filed on Jul. 25, 2019, which is hereby incorporated by reference for all purposes as if fully set forth herein.

BACKGROUND

Field

Exemplary embodiments of the present invention relate generally to a display device and a method for manufacturing the same and, more specifically, to a foldable display device and a method for manufacturing the same.

Discussion of the Background

Electronic devices, such as televisions, mobile phones, tablet computers, navigators, game consoles, and the like are provided with display devices for providing information.

In recent years, various types of display devices have been developed with the development of technology of display devices. For example, flexible display devices that is foldable (or bendable) or rollable are being developed. The flexible display device that can be variously modified in shape may be easily carried and improve user's convenience.

The above information disclosed in this Background section is only for understanding of the background of the inventive concepts, and, therefore, it may contain information that does not constitute prior art.

SUMMARY

Foldable display devices constructed according to exemplary embodiments of the invention and methods for manufacturing the same are capable of improving reliability.

Additional features of the inventive concepts will be set forth in the description which follows, and in part will be apparent from the description, or may be learned by practice of the inventive concepts.

A method for manufacturing a display device including display panel having a folding area configured to be folded along a virtual folding axis and first and second non-folding areas adjacent to both sides of the folding area, and a window disposed on the display panel and configured to be folded along with the display panel, the method includes preparing a mother substrate having an effective area and a non-effective area divided by a cutting line as a boundary, performing a first laser process along a first cutting line of the cutting line disposed in the first non-folding area, performing a second laser process along a second cutting line of the cutting line disposed in the second non-folding area, and performing a third laser process along a third cutting line of the cutting line disposed in the folding area, in which a first end of the third cutting line overlaps a first end of the first cutting line, and a second end of the third cutting line overlaps a first end of the second cutting line.

The third laser process may be performed by irradiating a second laser beam having an energy less than that of a first laser beam used in the first laser process.

The first laser beam may be irradiated at a first rate in the first laser process, and the second laser beam may be irradiated at a second rate greater than the first rate in the third laser process.

The second laser process may be performed by irradiating the first laser beam.

The first cutting line may include a first start point and a first end point, the second cutting line may include a second start point and a second end point, and the third cutting line may include a third start point and a third end point.

The third start point of the third cutting line may be disposed on the first cutting line, and the third end point of the third cutting line is disposed on the second cutting line.

The third laser process may start at the third start point of the third cutting line and end at the third end point of the third cutting line while passing through the first start point of the first cutting line and the second end point of the second cutting line.

Each of the first laser process and the second laser process may be performed by irradiating a first laser beam having a first energy level, the third laser process may include a first sub-laser process of irradiating a second laser beam having a third energy level from the third start point of the third cutting line to the first start point of the first cutting line, a second sub-laser process of irradiating the second laser beam having the third energy level from the first start point of the first cutting line to the second end point of the second cutting line, and a third sub-laser process of irradiating the second laser beam having a second energy level from the second end point of the second cutting line to the third end point of the third cutting line, and the first energy level, the second energy level, and the third energy level may have laser power different from each other.

The first energy level may be greater than the second energy level, and the second energy level may be greater than the third energy level.

The method may further include performing a fourth laser process along a fourth cutting line of the cutting line disposed in the folding area, in which a first end of the fourth cutting line overlaps a second end of the first cutting line, and a second end of the fourth cutting line overlaps a second end of the second cutting line.

A fourth start point of the fourth cutting line may be disposed on the first cutting line, and a fourth end point of the fourth cutting line may be disposed on the fourth cutting line.

Each of the first laser process and the second laser process may be performed by irradiating a first laser beam having a first energy level, and the fourth laser process may be performed by irradiating a second laser beam having energy less than that of the first laser beam.

The first to fourth cutting lines may form a closed curve shape that surrounds the effective area, and the non-effective area of the mother substrate may be removed after the first to fourth laser processes are performed along the first to fourth cutting lines.

A display device according to another exemplary embodiment includes a display panel configured to display an image and including a folding area configured to be folded along a virtual folding axis and a non-folding area adjacent to a side of the folding area, and a window disposed on the display panel and including a soft material, such that the window is configured to be folded along with the display panel, in which the non-folding area includes a first area and a second area sequentially disposed in a first direction, the second area being disposed adjacent to the folding area, and a portion of a side surface of the window disposed in the first area has a first width range from a reference line parallel to the first direction and a portion of the side surface of the window disposed in the second area has a second width range different from the first width range from the reference line.

The second width range may be greater than the first width range.

The window may include a base layer, a window functional layer disposed on the base layer, and a window protection layer covering the window functional layer.

The side surface of the window may include a side surface of the base layer, a side surface of the window functional layer, and a side surface of the window protection layer.

A portion of the side surface of the window in the non-folding area may have a first surface roughness and a portion of the side surface of the window in the folding area may have a second surface roughness less than the first surface roughness.

The display device may further include a functional layer disposed between the display panel and the window.

The display device may further include a protection film disposed on a rear surface of the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
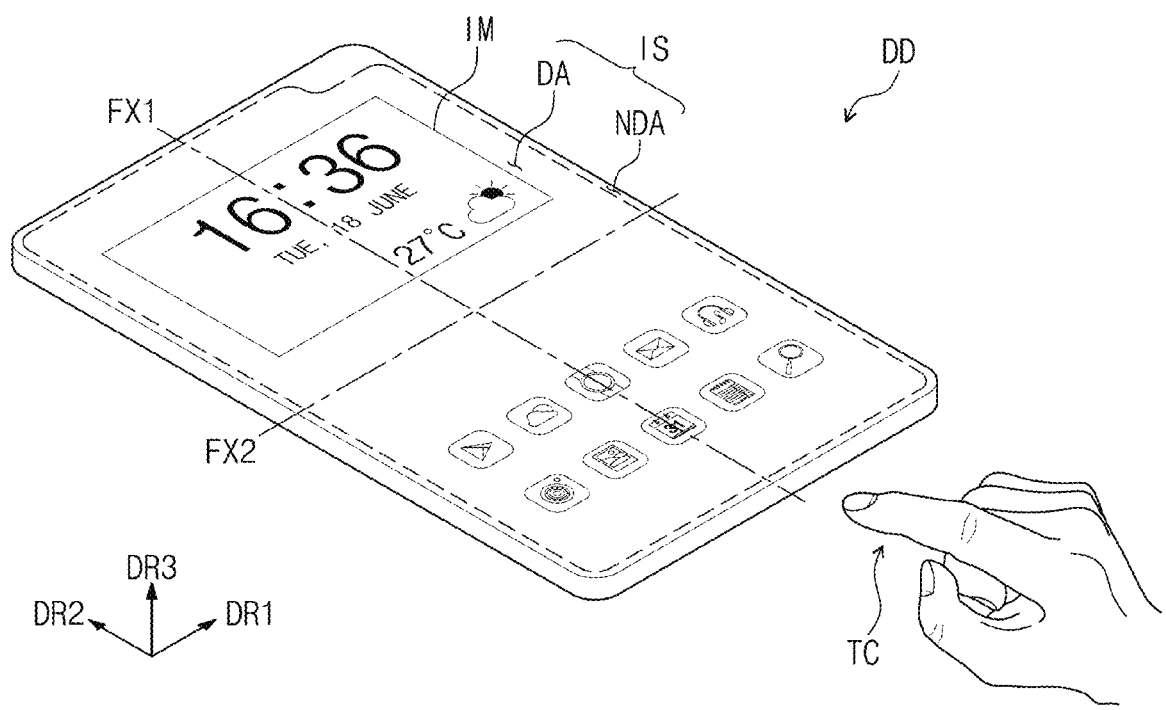
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described with reference to the accompanying drawings.

FIG. 1 is a perspective view of a display device according to an exemplary embodiment.

Referring to FIG. 1, a display device DD according to an exemplary embodiment has substantially a rectangular shape with a short side in a first direction DR1 and a long side in a second direction DR2 crossing the first direction DR1. However, the inventive concepts are not limited to a particular shape of the display device DD, and in other exemplary embodiments, the display device DD may have various shapes.

The display device DD may be a folding-type (foldable) electronic device. More particularly, the display device DD according to an exemplary embodiment may be folded with respect to folding axes FX1 and FX2 extending in respective predetermined direction. Hereinafter, the folded state with respect to the folding axes FX1 and FX2 may be referred to as a folded state, and the unfolded state may be referred to as a non-folded state.

The folding axes FX1 and FX2 may extend in the first direction DR1 or the second direction DR2. In an exemplary embodiment, the folding axis extending in the second direction DR2 is defined as a first folding axis FX1, and a folding axis extending in the first direction DR1 is defined as a second folding axis FX2. The display device DD may include only one of the first folding axis FX1 and the second folding axis FX2. In particular, the display device DD may be folded along the first folding axis FX1 or the second folding axis FX2.

The display device DD may be used for large-sized display devices, such as televisions, monitors, and the like, and small and middle-sized display devices, such as mobile phones, tablet PC, navigation units for vehicles, game consoles, and the like. However, the inventive concepts are not limited thereto, and in other exemplary embodiments, the display device DD may be adopted for other electronic equipment.

As illustrated in FIG. 1, the display device DD may display an image IM in a third direction DR3 on a display surface IS that is parallel to each of the first and second directions DR1 and DR2. The display surface IS, on which the image IM is displayed, may correspond to a front surface of the electronic device DD.

The display surface IS of the display device DD may be divided into a plurality of areas. A display area DA and a non-display area NDA may be defined on the display surface IS of the display device DD.

The display area DA may be an area on which an image IM is displayed, and a user may see the image IM through the display area DA. The display area DA may have substantially a rectangular shape. The non-display area NDA may surround the display area DA. Thus, the shape of the display area DA may be substantially defined by the non-display area NDA. However, the inventive concepts are not limited thereto. For example, in some exemplary embodiments, the non-display area NDA may be disposed adjacent to only one side of the display area DA, or may be omitted. The display device DD according to an exemplary embodiment may be implemented in various manners, and is not limited to a specific exemplary embodiment.

The non-display area NDA is an area adjacent to the display area DA, and on which the image IM is not displayed. A bezel area of the display device DD may be defined by the non-display area NDA.

The non-display area NDA may surround the display area DA. However, the inventive concepts are not limited thereto. For example, in some exemplary embodiments, the non-display area NDA may be disposed adjacent to only a portion of an edge of the display area DA.

The display device DD may sense a user's input TC applied from the outside. The user's input TC includes various types of external inputs, such as a portion of user's body, light, heat, a pressure, or the like. In the illustrated exemplary embodiment, the user's input TC is exemplarily illustrated as a user's hand applied to the front surface. However, the inventive concepts are not limited thereto. As described above, the user's input TC may be provided in various forms, for example, input using a user's hand, input using a mechanism, such as a touch pen or a stylus pen, and the like. Also, the display device DD may sense the user's input TC applied to a side surface or a rear surface of the display device DD according to the structure of the display device DD, without being limited thereto.

The display device DD may activate the display surface IS to display the image IM and also sense an external input TC. In the illustrated exemplary embodiment, an area on which the external input TC is sensed may be provided on the display area DA, on which the image IM is displayed. However, the inventive concepts are not limited thereto. For example, the area on which the external input TC may be provided on the non-display area NDA, or provided on an entire area of the display surface IS.

Figure 2A:
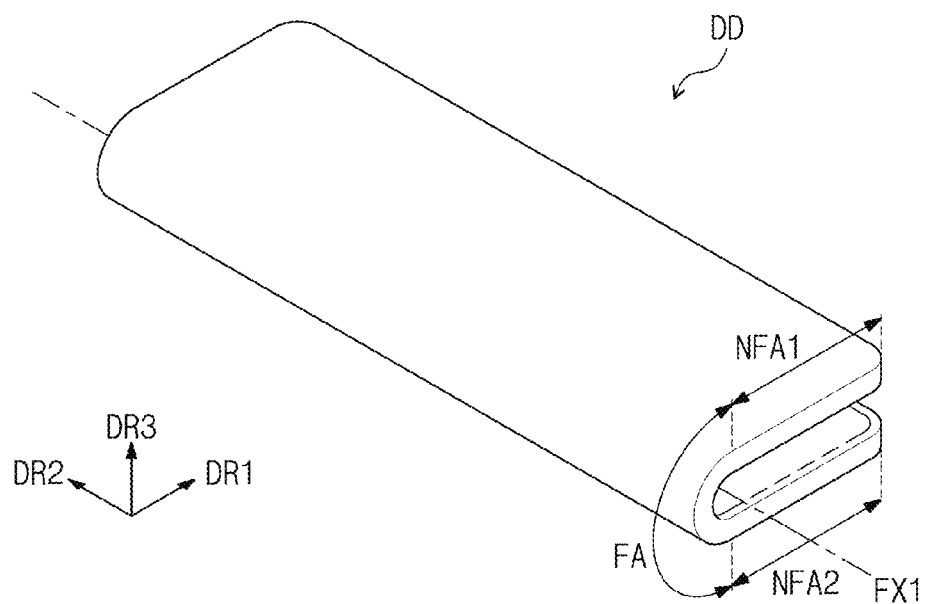
FIG. 2A is a view illustrating a state in which the display device of FIG. 1 is in-folded along a first folding axis.
Figure 2B:
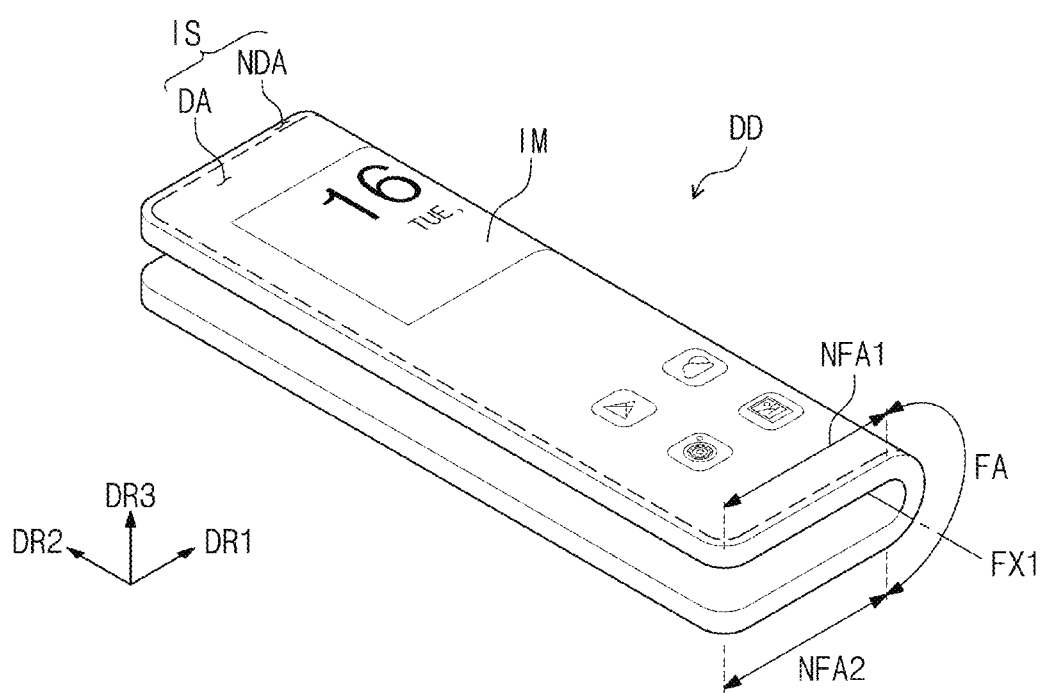
FIG. 2B is a view illustrating a state in which the display device of FIG. 1 is out-folded along the first folding axis.

FIG. 2A is a view illustrating a state in which the display device of FIG. 1 is in-folded along a first folding axis, and FIG. 2B is a view illustrating a state in which the display device of FIG. 1 is out-folded along the first folding axis.

Referring to FIGS. 1 and 2A, the display device DD may be in-folded with respect to the first folding axis FX1.

A plurality of areas may be defined on the display device DD according to an operation type. The plurality of areas may be divided into a folding area FA and at least one non-folding area NFA1 or NFA2. The folding area FA is defined between the two non-folding areas NFA1 and NFA2.

According to an exemplary embodiment, the non-folding areas NFA1 and NFA2 may include a first non-folding area NFA1 and a second non-folding area NFA2. The first non-folding area NFA 1 may be adjacent to one side of the folding area FA in the first direction DR1, and the second non-folding area NFA2 may be adjacent to the other side of the folding area FA in the first direction DR1.

The display device DD may be in-folded or out-folded. As used herein, the in-folding refers to folding of the display surface IS to face each other, and the out-folding refers to folding of the rear surface of the display device DD to face each other.

The folding area FA is an area that is folded with respect to the first folding axis FX1 to substantially form a curvature. The first folding axis FX1 may extend in the second direction DR2, that is, in a direction substantially parallel to the long side of the display device DD (long side direction).

The display device DD illustrated in FIG. 2A may be in-folded so that the display surface IS of the first non-folding area NFA1 and the display surface IS of the second non-folding area NFA2 face each other.

Referring to FIG. 2B, the display device DD may be out-folded with respect to the first folding axis FX1. When the display device DD is out-folded, the display surface IS may be exposed to the outside.

In an exemplary embodiment, the display device DD may in-folded and out-folded. However, in the following description, the display device DD will be exemplarily be described as being in-folded or out-folded.

Figure 3A:
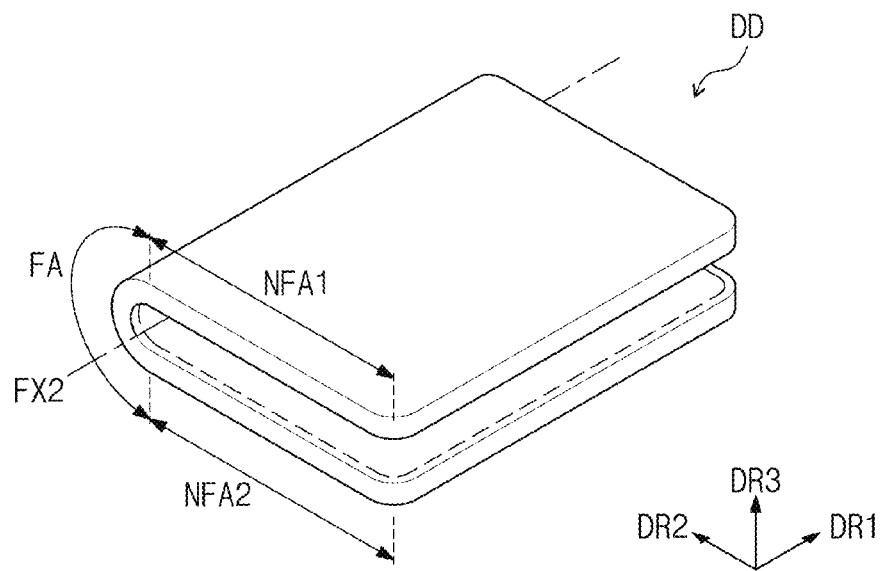
FIG. 3A is a view illustrating a state in which the display device of FIG. 1 is in-folded along a second folding axis.
Figure 3B:
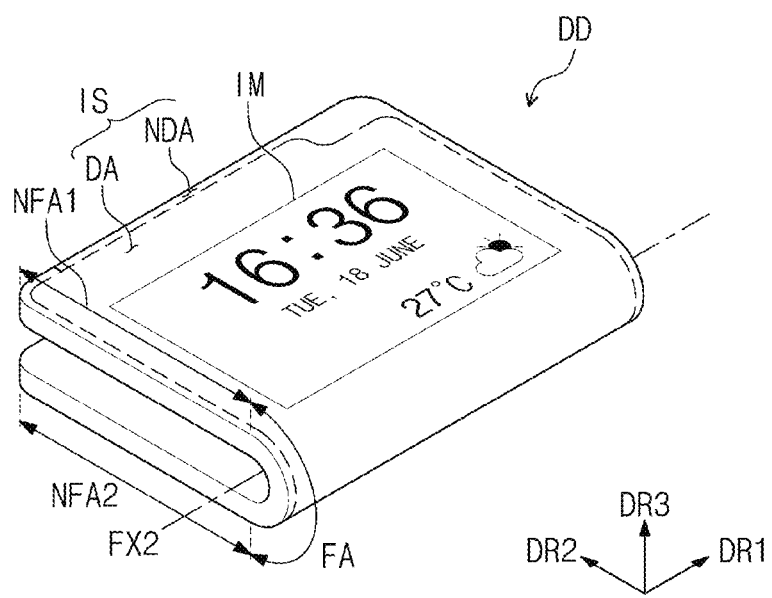
FIG. 3B is a view illustrating a state in which the display device of FIG. 1 is out-folded along the second folding axis.

FIG. 3A is a view illustrating a state in which the display device of FIG. 1 is in-folded along the second folding axis, and FIG. 3B is a view illustrating a state in which the display device of FIG. 1 is out-folded along the second folding axis.

Referring to FIGS. 3A and 3B, the display device DD may be in-folded or out-folded with respect to the second folding axis FX2. The second folding axis FX2 may extend in the first direction DR1, e.g., a direction substantially parallel to the short side of the display device DD (short side direction).

In the illustrated exemplary embodiment, although the display device DD is shown as including one folding area FA, however, the inventive concepts are not limited thereto. According to another exemplary embodiment, a plurality of folding areas may be defined on the display device DD.

Figure 4:
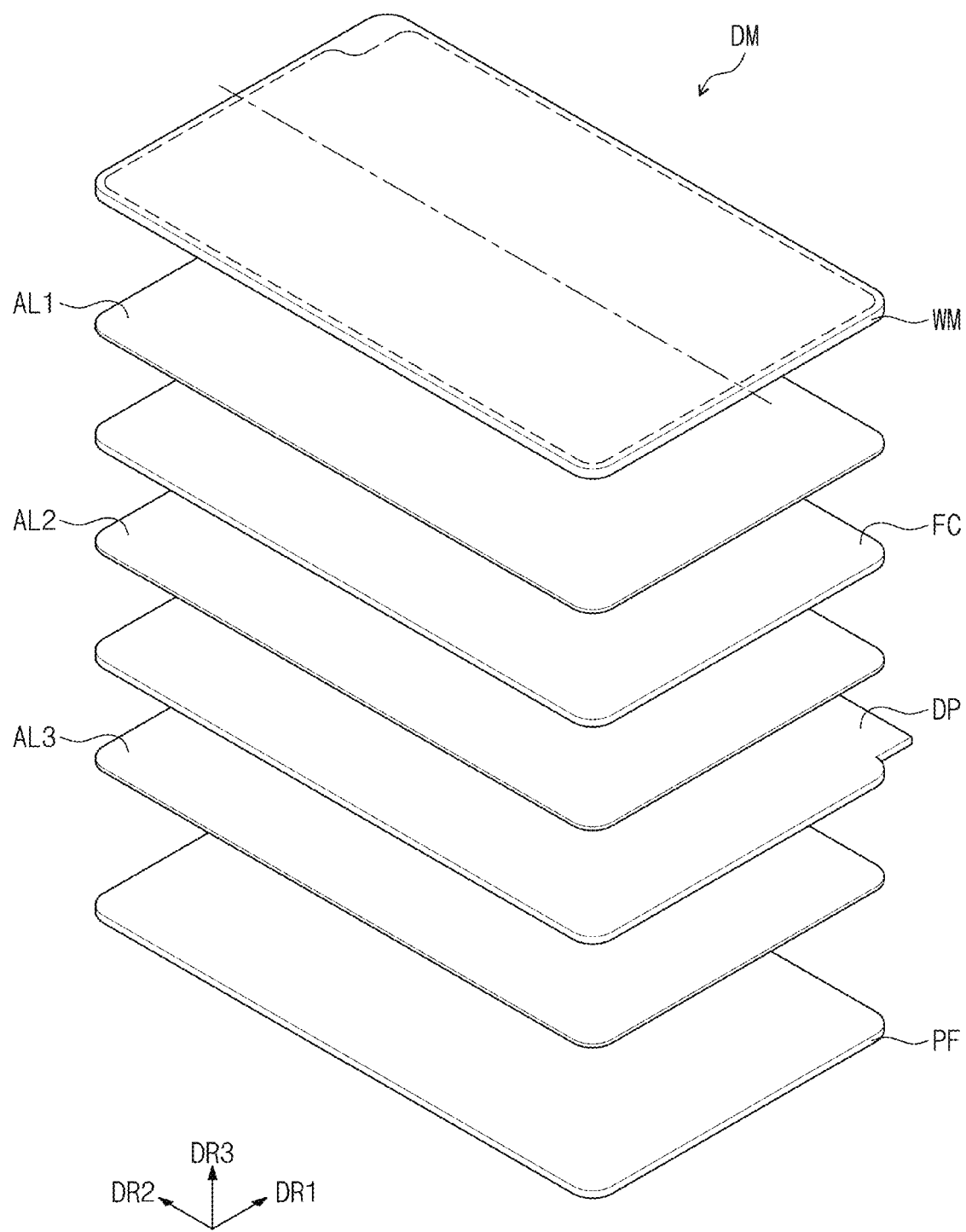
FIG. 4 is an exploded view of a display module DM according to an exemplary embodiment.
Figure 5:
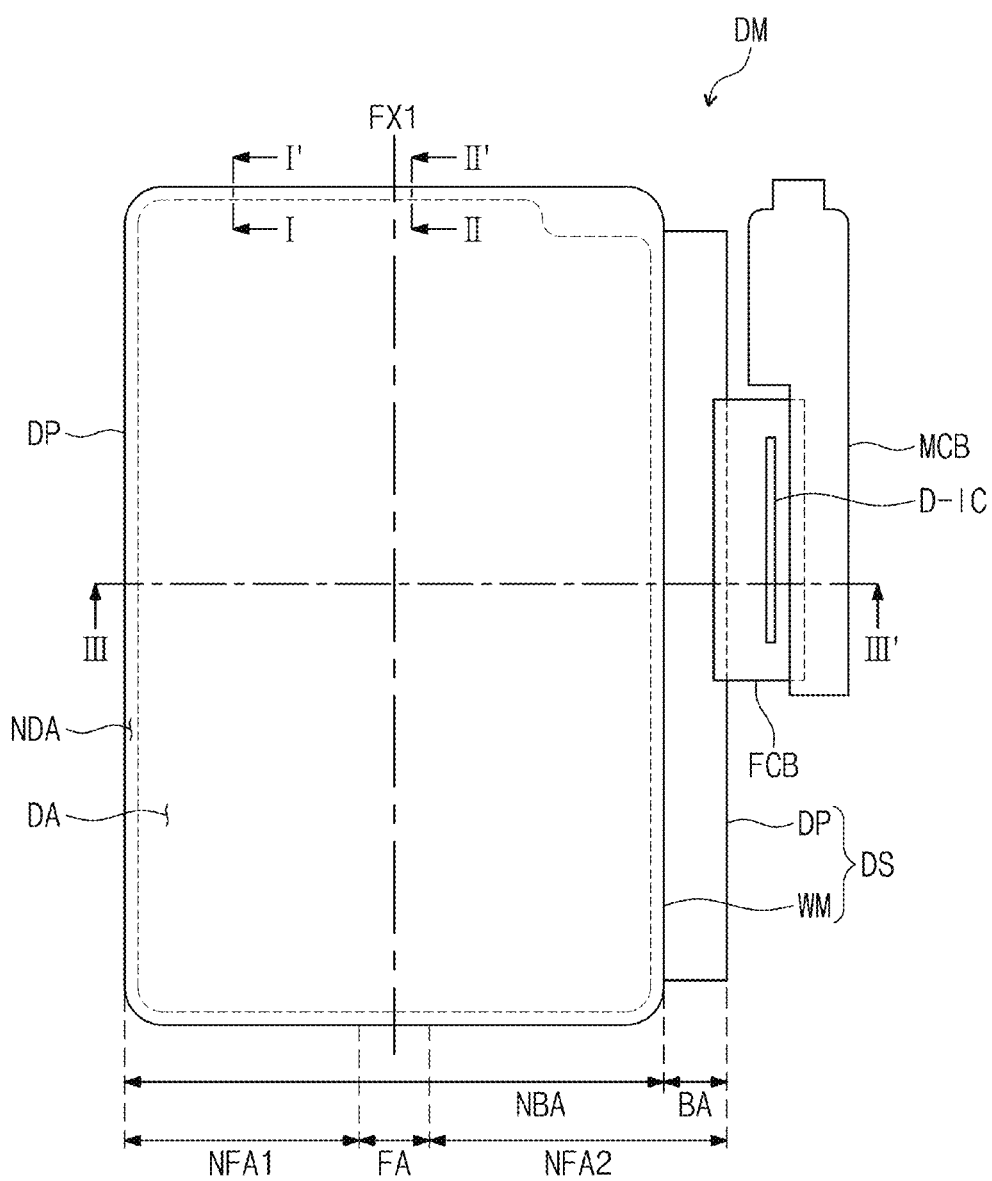
FIG. 5 is a plan view of the display module of FIG. 4.

FIG. 4 is a perspective view of a display module DM according to an exemplary embodiment, and FIG. 5 is a plan view of the display module of FIG. 4.

The display module DM according to an exemplary embodiment may include a display panel DP displaying an image and a window module WM disposed on the display panel DP. The display module DM may form a portion of the display device DD (see FIG. 1), and in particular, the display module DM may provide the display surface IS (see FIG. 1) of the display device DD.

The display panel DP may be a flexible display panel. Thus, the display panel DP may be folded or unfolded with respect to the first folding axis FX1. According to an exemplary embodiment, the display panel 110 may be an organic light emitting display panel.

The display panel DP may be divided into the folding area FA, a first non-folding area NFA1, and the second non-folding area NFA2. The display panel DP may be divided into a non-bending area and a bending area BA. A portion of the folding area FA, the first non-folding area NFA1, and the second non-folding area NFA2 of the display panel DP may be disposed on the non-bending area NBA, and the other portion of the second on-folding area NFA2 may be disposed on the bending area BA. The bending area BA will be described later in detail.

A top surface of the window module WM defines the display surface IS of the display device DD illustrated in FIG. 1. The window WM may be optically transparent. Thus, an image generated in the display panel DP may pass through the window module WM and be easily recognized by the user.

The window module WM may be made of a flexible material. Thus, the window module WM may be folded or unfolded with respect to the first folding axis FX1. More particularly, the window module WM may be deformed in shape together with deformation in shape of the display panel DP.

The window module WM may transmit the image transmitted from the display panel DP, and also mitigate an external impact to prevent the display panel DP from being damaged or malfunctioned by the external impact. The external impact may be a force applied from the outside, which is expressed as a pressure, stress, or the like, e.g., force that causes defects in the display panel DP. The window module WM may prevent defects in the display panel DP by alleviating bending deformation, compression deformation, and/or tensile deformation of the display panel DP due to a point impact and a surface impact.

One or more functional layers FC may be disposed between the display panel DP and the window module WM. According to an exemplary embodiment, the functional layers FC may include an anti-reflection layer that blocks reflection of external light. The anti-reflection layer may prevent elements forming the display panel DP from being visible by the external light incident through the front surface of the display device DD. The anti-reflection layer may include a polarizing film and/or a phase retardation film. The number of phase retardation films and a phase retardation length (λ/4 or λ/2) of the phase retardation film may be determined according to an operating principle of the anti-reflection layer.

The functional layer FC may further include an input sensing layer sensing the user's input TC (see FIG. 1). The input sensing layer may be provided as a separate layer with respect to the display panel DP, and may be coupled through an adhesion layer. In another exemplary embodiment, the input sensing unit may be integrated with the display panel DP through at least one continuous process. More particularly, the input sensing unit may be directly disposed on an encapsulation layer of the display panel DP. As used herein, the term "directly" disposed may refer that the input sensing circuit is disposed on the display panel DP without using a separate adhesion member. In an exemplary embodiment, the input sensing unit is disposed on the top surface of the display panel DP, without being limited thereto. In another exemplary embodiment, the input sensing layer may be disposed on a bottom surface of the display panel.

The window module WM and the functional layer FC may adhered to each other through a first adhesion layer AL1. The display panel DP and the functional layer FC may adhered to each other through a second adhesion layer AL2.

The first adhesion layer AL1 and the second adhesion layer AL2 may be optically transparent, respectively. Each of the first adhesion layer AL1 and the second adhesion layer AL2 may be an adhesion layer prepared by applying and curing a liquid adhesion material, or may be an adhesion sheet prepared separately. For example, each of the first adhesion layer AL1 and the second adhesion layer AL2 may be a pressure sensitive adhesive (PSA), an optical clear adhesive (OCA), or an optical clear resin (OCR).

A protection film PF may be disposed on a rear surface of the display panel DP. The protection film PF may include a polymer material. The protection film PF may be a layer for absorbing an impact applied from the outside to protect the display panel DP from the impact. The protection film PF may be attached to the rear surface of the display panel DP through a third adhesion layer AL3.

Although the protection film PF is illustrated as being disposed on the rear surface of the display panel DP in FIG. 4, the inventive concepts are not limited thereto. For example, in some exemplary embodiments, the display module DM may further include an upper protection film disposed between the display panel DP and the functional layer FC.

A material forming the protection film PF is not limited to a plastic resin, and thus, may include an organic/inorganic composite material. The protection film PF may include a porous organic layer and an inorganic material filled in the pores of the organic layer.

In the display substrate DS illustrated in FIG. 5, the protection film PF, the display panel DP, the functional layer FC, and the window module WM, which are illustrated in FIG. 4, may be coupled to each other.

The display module DM may further include a flexible circuit board FCB connected to the display panel DP, and a driving chip D-IC mounted on the flexible circuit board FCB. The flexible circuit board FCB may be connected to a main circuit board MCB.

Components, such as a control chip, a plurality of passive elements, and a plurality of active elements, may be mounted on the main circuit board MCB. The main circuit board MCB may be provided as a flexible film like the flexible circuit board FCB.

In the illustrated exemplary embodiment, the display module DM has a chip on film (COF) structure, in which the driving chip D-IC is mounted on the flexible circuit board FCB. However, the inventive concepts are not limited thereto. For example, the display module DM may have a chip on panel (COP) or chip on glass (COG) structure, in which the driving chip D-IC is mounted on the display panel DP.

Figure 6A:
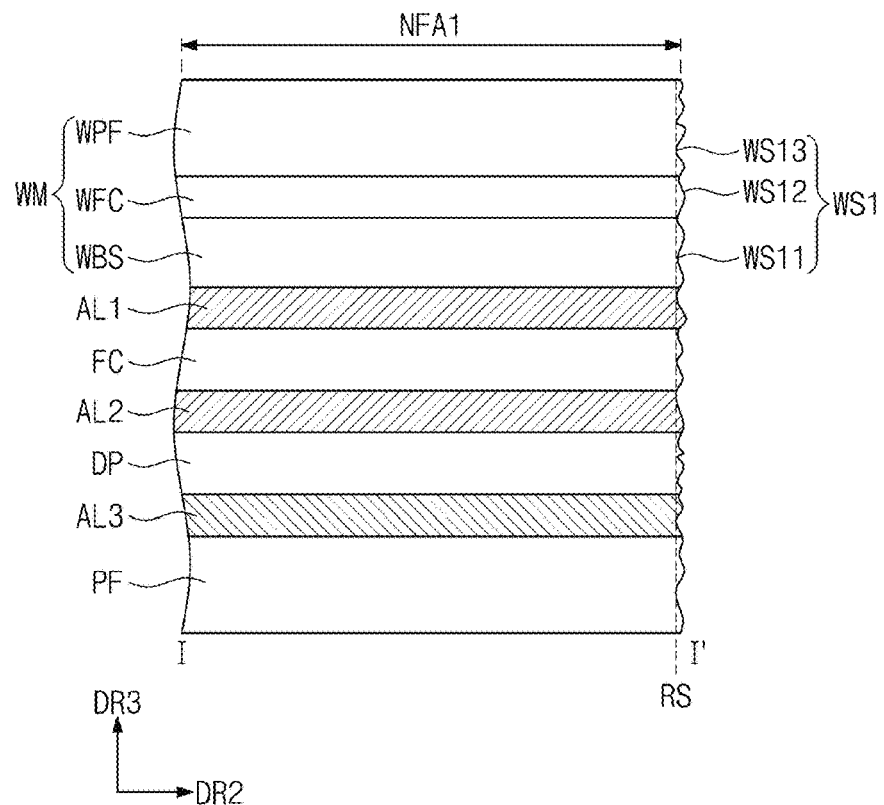
FIG. 6A is a cross-sectional view of a non-folding area, taken along line I-I' of FIG. 5.

FIG. 6A is a cross-sectional view of the non-folding area, taken along line I-I' of FIG. 5, and FIG. 6A is a cross-sectional view of the folding area, taken along line II-II' of FIG. 5.

Figure 6B:
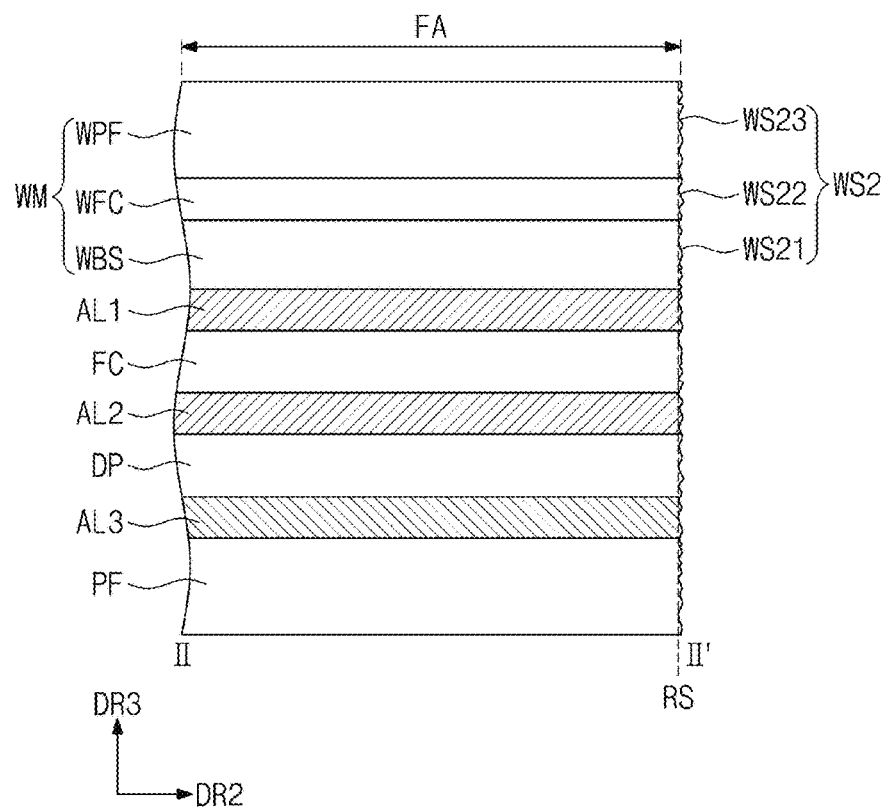
FIG. 6B is a cross-sectional view of a folding area, taken along line II-II' of FIG. 5.

Referring to FIGS. 6A and 6B, the window module WM may include a base layer WBS, a window module functional layer WFC, and a window module protection layer WPF. The base layer WBS, the window module function layer WFC, and the window module protection layer WPF may be sequentially laminated in the third direction DR3 (see FIG. 1).

The base layer WBS may include a transparent insulation material. The base layer WBS may be flexible. However, the inventive concepts are not limited thereto. For example, in some exemplary embodiments, the base layer WBS may include a material that is capable of being bent by controlling a thickness thereof even when the base layer is rigid.

In an exemplary embodiment, the base layer WBS may include at least one of polyimide (PI), polyamideimide (PAI), polyetheretherketone (PEEK), polyetherimide (PEI), or thin film glass. However, the inventive concepts are not limited thereto, and the base layer WBS may include various other materials.

The window module functional layer WFC may be disposed on the base layer WBS. For example, the window module functional layer WFC may include at least one of an anti-fingerprint layer, an anti-reflection layer, an anti-glare layer, or a hard coating layer. The window module functional layer WFC may be provided on a top surface of the base layer WBS, that is, a surface facing the user. The hard coating layer of the window module functional layer WFC serves to protect the base layer WBS from the external impact. The hard coating layer may have press-fit hardness greater than that of the base layer WBS. Therefore, the hard coating layer may include at least one of a urethane resin, an epoxy resin, an acrylic resin, or an acrylate resin.

The window module protection layer WPF is disposed on the window module functional layer WFC. The window module protection layer WPF may be a layer for improving impact resistance of the window module WM and preventing scattering during breakage. In particular, when the window module functional layer WFC includes the hard coating layer, the window module protection layer WPF may absorb the external impact and protect the hard coating layer from the external impact to improve the impact resistance of the hard coating layer.

The window module protection layer WPF may include at least one selected from an urethane resin, an epoxy resin, a polyester resin, a polyether resin, an acrylate resin, an acrylonitrile-butadiene-styrene (ABS) resin, and rubber. In an exemplary embodiment, the window module protection layer WPF may include at least one of phenylene, polyethylene terephthalate (PET), polyimide (PI), polyamide (PAI), polyethylene naphthalate (PEN), or polycarbonate (PC).

In an exemplary embodiment, an adhesion layer may be further disposed between the window module protection layer WPF and the window module functional layer WFC.

A first side surface WS1 on the first non-folding area NFA1 of the window module WM has first surface roughness, and the second side surface WS2 on the folding area FA has second surface roughness. Although not shown in the drawings, in the second non-folding area NFA2 of the window module WM, a third side surface may have the same first surface roughness as the first side surface WS1. The second surface roughness is less than the first surface roughness. The first surface roughness may be defined as an average value of heights from a reference surface RS parallel to the third direction DR3 to the first side surface WS1 of the window module WM on the first non-folding areas NFA1. The second surface roughness may be defined as an average value of height from a reference surface RS to the second side surface WS2 of the window module WM on the folding area FA.

The first side surface WS1 of the window module WM may include a side surface WS11 of the base layer WBS, a side surface WS12 of the window module functional layer WFC, and a side surface WS13 of the window module protection layer WPF. When the adhesion layer is disposed between the window module functional layer WFC and the window module protection layer WPF, the first side surface WS1 of the window module WM may further include a side surface of the adhesion layer.

The second side surface WS2 of the window module WM may include a side surface WS21 of the base layer WBS, a side surface WS22 of the window module functional layer WFC, and a side surface WS23 of the window module protection layer WPF. When the adhesion layer is disposed between the window module functional layer WFC and the window module protection layer WPF, the second side surface WS2 of the window module WM may further include a side surface of the adhesion layer.

The first surface roughness of the first side surface WS1 of the window module WM may be defined as an average value of heights of the side surface WS11 of the base layer WBS, the side surface WS12 of the window module functional layer WFC, and the side surface WS13 of the window module protection layer WPF to the reference surface RS. The second surface roughness of the second side surface WS of the window module WM may be defined as an average value of heights of the side surface WS21 of the base layer WBS, the side surface WS22 of the window module functional layer WFC, and the side surface WS23 of the window module protection layer WPF to the reference surface RS.

Surface modification may occur on the first side surface WS1 of the window module WM by a laser process, which may be performed along a cutting line to complete the display module DM. In this case, the second surface roughness of the second side surface WS2 being less than the first surface roughness of the first side surface WS1 may represent that the surface modification of the second side surface WS2 on the folding area FA occurs less than that of the first side surface WS1 on the first non-folding area NFA1. In particular, it may mean that stress and damage applied to the folding area FA during the laser process are relatively small than those in the non-folding area NFA. As described above, since the stress and damage applied to the folding area FA in the processing process are minimized, even if the folding operation is repeated on the folding area FA of the completed display device DD, defects, such as cracks, may be prevented or at least be suppressed from occurring in the folding area FA.

Figure 7A:
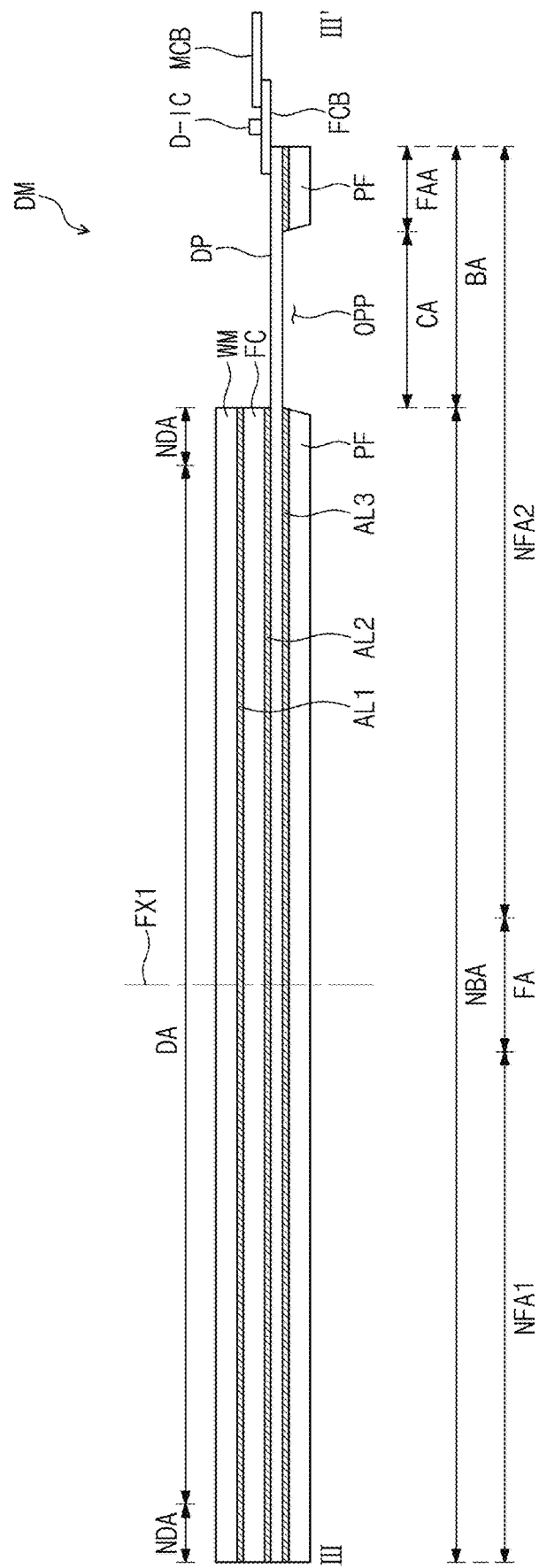
FIG. 7A is a cross-sectional view taken along line of FIG. 5.
Figure 7B:
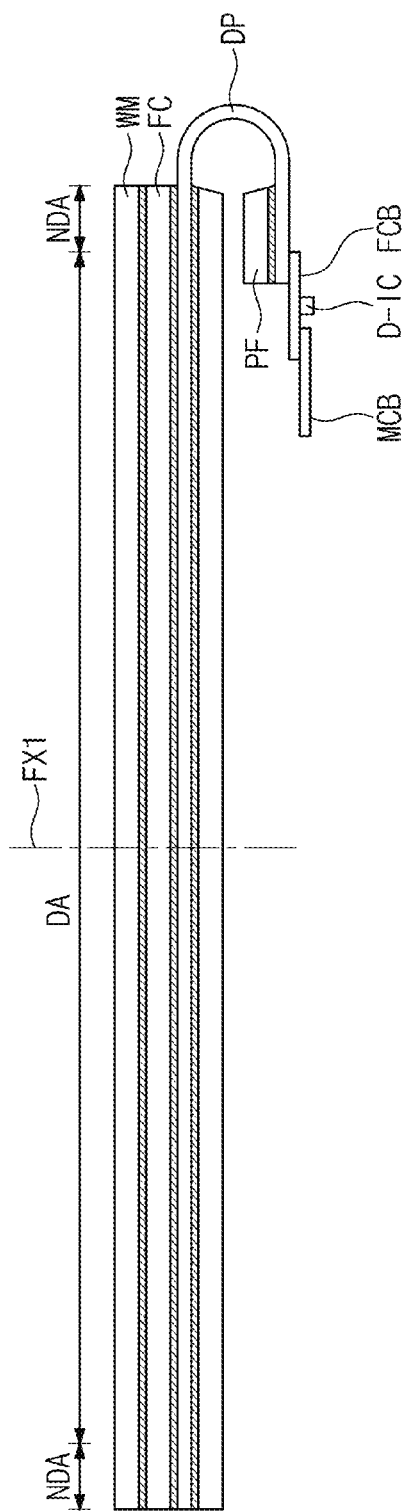
FIG. 7B is a cross-sectional view illustrating a state in which a portion of a display panel of FIG. 5 is bent.

FIG. 7A is a cross-sectional view taken along line of FIG. 5. FIG. 7B is a cross-sectional view illustrating a state in which a portion of a display panel of FIG. 5 is bent.

Referring to FIGS. 5, 7A, and 7B, the display module DM may include a flexible display panel DP. In FIGS. 7A and 7B, the display panel DP is exemplarily illustrated as a single layer. Although not illustrated in the drawings, the display panel DP may include a base layer, a circuit layer, a light emitting element layer, and an encapsulation layer.

The display panel DP may be divided into a bending area BA and a non-bending area NBA. The non-bending area NBA may be an area including the display area DA and the non-display area NDA of the display module DM. Also, a portion of the folding area FA, the first non-folding area NFA1, and the second non-folding area NFA2 of the display panel DP may be disposed on the non-bending area NBA, and the other portion of the second non-folding area NFA2 may be disposed on the bending area BA. The bending area BA of the display panel DP may be bent toward the rear surface of the display panel DP at a predetermined curvature.

The bending area BA includes a curvature area CA and an opposite area FAA. The curvature area CA is an area that is adjacent to the non-bending area NBA and may be substantially bent. The opposite area FAA is adjacent to the curvature area CA and faces the non-bending area NBA in a bent state. The flexible circuit board FCB is connected to the opposite area FAA of the display panel DP.

The protection film PF may be disposed to correspond to the non-bending area NBA and the opposite area FAA, and may not be disposed on the curvature area CA. The bending open part OPP may be defined in the protection film PF to correspond to the curvature area CA. Since the protection film PF is removed from the curvature areas CA, stress generated in the curvature areas CA may be reduced during the bending. When the bending open part OPP is defined in the protection film PF according to an exemplary embodiment, the third adhesion layer AL3 may be removed in the bending open part OPP.

In another exemplary embodiment, the protection film PF may have a groove defined to correspond to the curvature area CA. More particularly, the protection film PF on the curvature area CA may have a thickness less than that of the protection film PF on the non-bending area NBA and the opposite area FAA.

FIGS. 8A to 8D are plan views illustrating a process of manufacturing a display panel according to an exemplary embodiment.

Referring to FIGS. 8A to 8D, a mother substrate MS divided into an effective area AA and an non-effective area NAA by using a cutting line as a boundary is prepared. The cutting line may include first to fourth cutting lines CL1 to CL4. The mother substrate MS may be in a state, in which each of the protection film PF, the display panel DP, the functional layer FC, and the window module WM, which are illustrated in FIG. 4, are formed and coupled to each other.

Figure 10:
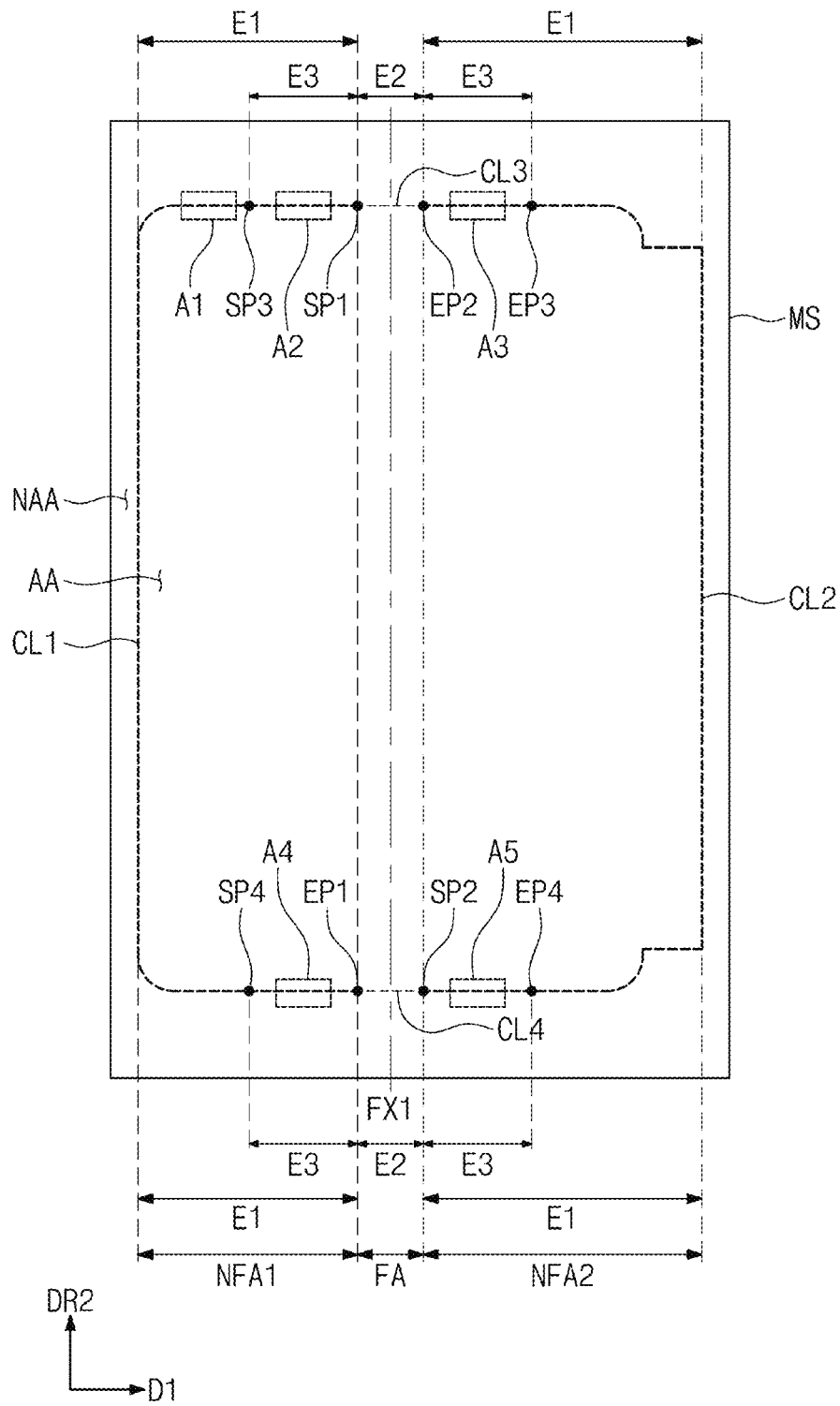
FIG. 10 is a view exemplarily illustrating a mother substrate according to another exemplary embodiment.

The first cutting line CL1 to the fourth cutting line CL4 may have a closed curve shape, and a cutting process is sequentially performed along the first cutting line CL1 to the fourth cutting line CL4 to form the display substrate DS of FIG. 5, which includes only the effective area AA without the non-effective area NAA (see FIG. 10).

In an exemplary embodiment described with reference to FIGS. 8A to 8D, the mother substrate MS includes only one display substrate DS. However, in some exemplary embodiments, a plurality of display substrates may be simultaneously formed on the mother substrate MS, and the cutting process may be performed to form the plurality of display substrates.

Figure 8A:
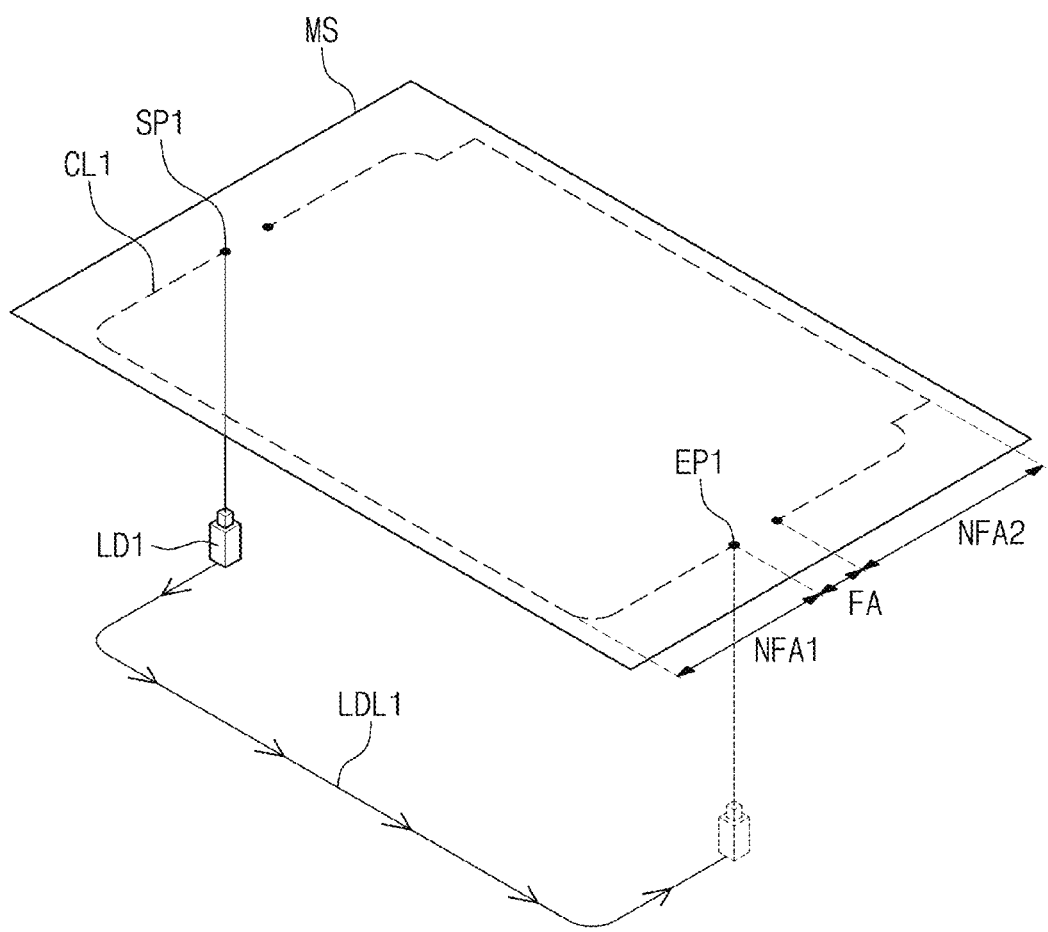
FIGS. 8A, 8B, 8C, and 8D are plan views illustrating a process of manufacturing a display panel according to an exemplary embodiment.

Referring to FIG. 8A, the first cutting line CL1 may be a path between a first start point SP1 and a first end point EP1, which are disposed on the first non-folding area NFA1, among paths defining the effective area AA. A first laser process may be performed using a first laser device LD1. The first laser process may include a process, in which the first laser device LD1 is disposed on a rear surface of the mother substrate MS, and the first laser device LD1 moves along a first laser path LDL1 so that laser beams are irradiated from the first start point SP1 to the first end point EP1 along the first cutting line CL1.

The rear surface of the substrate MS may be defined as a surface opposite to a front surface that provides the display surface IS (see FIG. 1) on the display module DM of FIG. 5. The first start point SP1 and the first end point EP1 may be disposed at the boundary between the first non-folding area NFA1 and the folding area FA. Also, the first start point SP1 and the first end point EP1 may be exchanged with each other. That is, the first laser process may include a process of irradiating the laser beams from the first end point EP1 to the first start point SP1 along the first cutting line CL1.

A portion of the non-effective area NAA, which is adjacent to the first non-folding area NFA1, may be removed through the first laser process. Here, the removed areas may be defined as a first portion of the non-effective areas NAA.

Figure 8B:
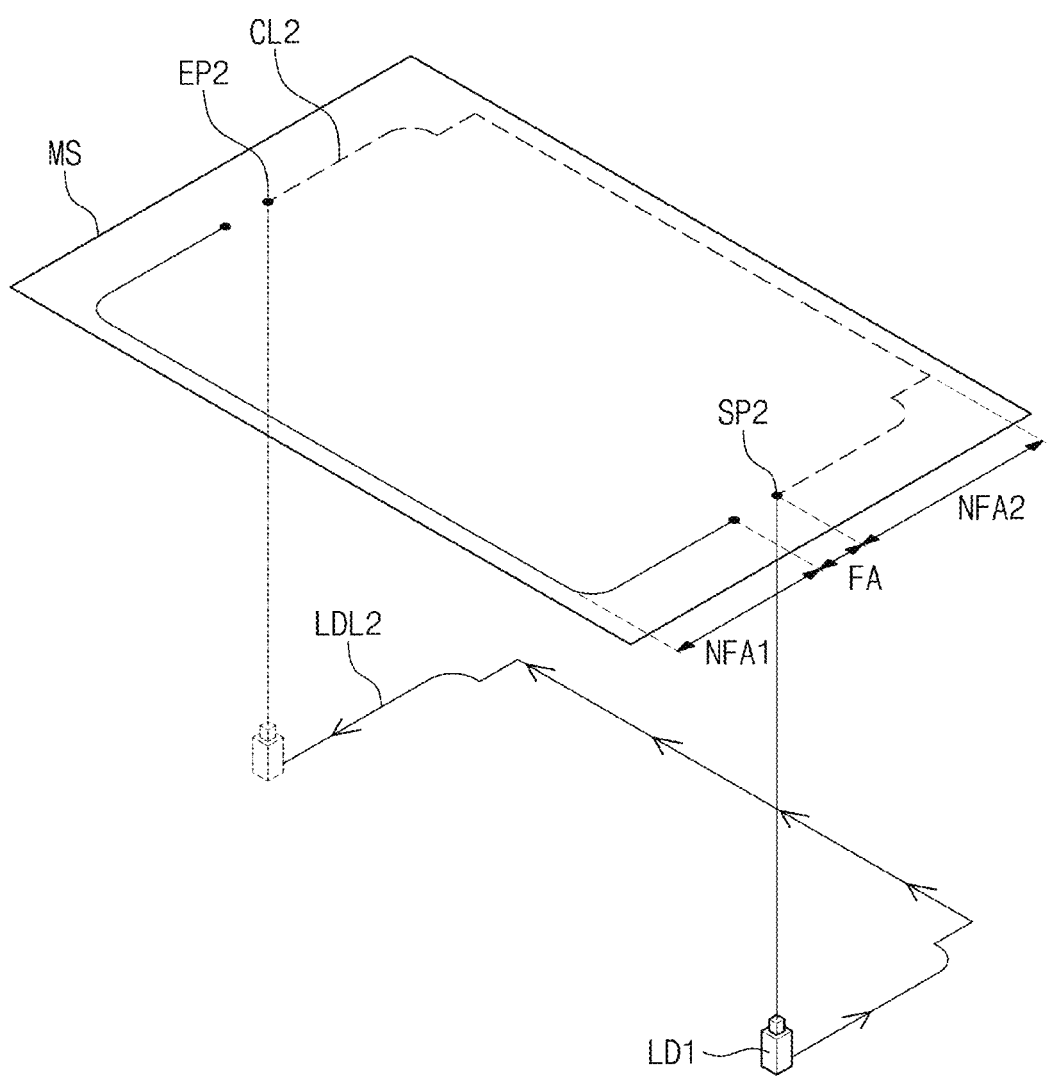

Referring to FIG. 8B, a second laser process is performed along the second cutting line CL2. The second cutting line CL2 is a path between the second start point SP2 and the second end point EP2, which are disposed on the second non-folding area NFA2, among paths defining the effective area AA.

The second laser process may be performed using the same first laser device LD1 as the first laser process. The second laser process may include a process, in which the first laser device LD1 is disposed on the rear surface of the mother substrate MS, and the first laser device LD1 moves along a second laser path LDL2 so that laser beams are irradiated from the second start point SP2 to the second end point EP2 along the second cutting line CL2.

The second start point SP2 and the second end point EP2 may be disposed at the boundary between the folding area FA and the second non-folding area NFA2. Also, the second start point SP2 and the second end point EP2 may be exchanged with each other. That is, the second laser process may include a process of irradiating the laser beams from the second end point EP2 to the second start point SP2 along the second cutting line CL2.

In an exemplary embodiment, the second cutting line CL2 includes, but is not limited thereto, a curved line. In an exemplary embodiment, since the bending area BA illustrated in FIG. 5 has a shape protruding from the non-bending area NBA, the second cutting line CL2 includes the curved line. In another exemplary embodiment, the second cutting line CL2 may have a shape that is symmetrical to the first cutting line CL1. A shape and length of each of the first cutting line CL1 and the second cutting line CL2 may be variously changed according to a shape and length of the path defining the effective area AA.

Figure 8C:
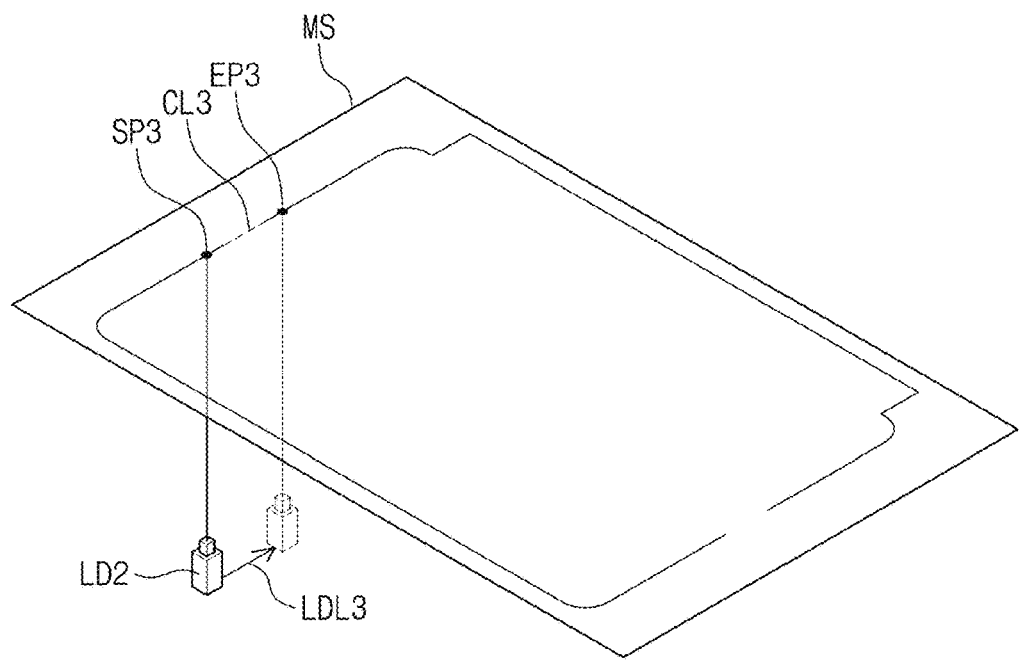

Referring to FIG. 8C, a third laser process is performed along the third cutting line CL3. The third cutting line CL3 is a path between the third start point SP3 and the third end point EP3.

The third laser process may be performed using a second laser device LD2 different from the first laser device LD1 used in the first laser process and the second laser process. The third laser process may include a process, in which the second laser device LD2 is disposed on the rear surface of the mother substrate MS, and the second laser device LD2 moves along a third laser path LDL3 so that the laser beams are irradiated from the third start point SP3 to the third end point EP3 along the third cutting line CL3.

The third start point SP3 may be disposed on the first non-folding area NFA1, and the third end point EP3 may be disposed on the second non-folding area NFA2. Also, the third start point SP3 and the third end point EP3 may be exchanged with each other. That is, the third laser process may include a process of irradiating the laser beams from the third end point EP3 to the third start point SP3 along the third cutting line CL3.

In an exemplary embodiment, the first end of the third cut line CL3 overlaps the first cut line CL1, and the second end of the third cut line CL3 overlaps the second cut line CL2.

Figure 8D:
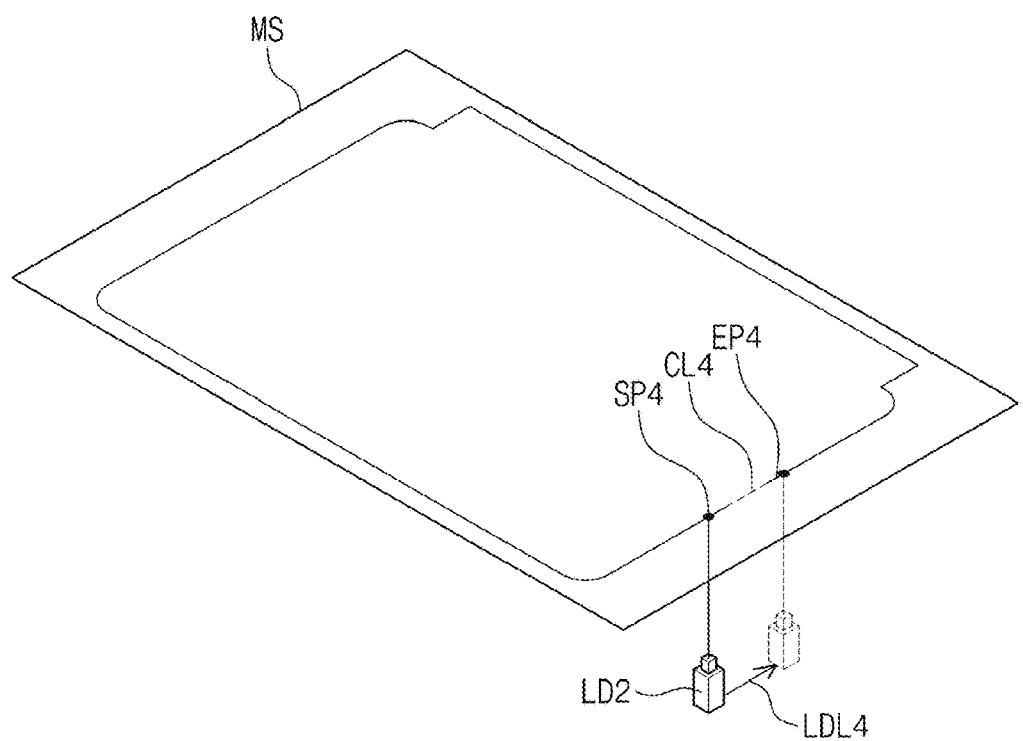

Referring to FIG. 8D, a fourth laser process is performed along the fourth cutting line CL4. The fourth cutting line CL4 is a path between the fourth start point SP4 and the fourth end point EP4.

The fourth laser process may be performed using the second laser device LD2 used in the third laser process. The fourth laser process may include a process, in which the second laser device LD2 is disposed on the rear surface of the mother substrate MS, and the second laser device LD2 moves along a fourth laser path LDL4 so that the laser beams are irradiated from the fourth start point SP4 to the fourth end point EP4 along the fourth cutting line CL4.

The fourth start point SP4 may be disposed on the first non-folding area NFA1, and the fourth end point EP4 may be disposed on the second non-folding area NFA2. Also, the fourth start point SP4 and the fourth end point EP4 may be exchanged with each other. That is, the fourth laser process may include a process of irradiating the laser beams from the fourth end point EP4 to the fourth start point SP4 along the fourth cutting line CL4.

In an exemplary embodiment, the first end of the fourth cut line CL4 overlaps the first cut line CL1, and the second end of the fourth cut line CL4 overlaps the second cut line CL2.

In this manner, the mother substrate MS may be cut into the shape of the display substrate DS illustrated in FIG. 5, which is employed in the actual display device DD through the first to fourth laser processes.

Each of the first and second laser processes may be defined as a high energy laser process, and each of the third and fourth laser processes may be defined as a low energy laser process. More particularly, the second laser device LD2 used in the third laser process and the fourth laser process may irradiate the laser beams having a lower energy than that of the first laser device LD1 used in the first laser process and the second laser process.

Each of the first laser process and the second laser process may include a process of repeatedly irradiating the laser beams N number of times. Each of the third laser process and the fourth laser process may include a process of repeatedly irradiating the laser beams M number times. M may have a value in a of about 3 N to about 3.5 N. That is, the number of times of laser irradiation in each of the third and fourth laser processes may be greater than that of times of laser irradiation in each of the first and second laser processes.

In each of the first laser process and the second laser process, the first laser device LD1 may irradiate the laser beam at a first rate, and in each of the three laser process and the fourth laser process, the second laser device LD2 may irradiate the laser beams at a second rate. The first rate may be different from the second rate. For example, the second rate may be greater than the first rate.

Although the first laser device LD1 is described as being used in the first laser process and the second laser process, and the second laser device different from the first laser device LD1 is described as being used in the third laser process and the fourth laser process, however, the inventive concepts are not limited thereto. For example, in some exemplary embodiments, the same laser device may be used for each of the first to fourth laser processes, but the energy of the laser beams used in each of the first to fourth laser processes may be set differently.

As described above, in the laser process of cutting the mother substrate MS, the first non-folding areas NFA1 and the second non-folding areas NFA2 may be cut by using the high energy laser, and the folding areas FA may be cut by using the low energy laser. As such, the stress applied to the second side surface WS2 of the folding area FA and the damage of the side surface during the cutting process may be reduced. Therefore, defects such as cracks due to the stress applied to the second side WS2 and the damage of the second side surface WS2 by the repeated folding operation may be reduced, which may improve the reliability of the foldable display device.

Figure 9:
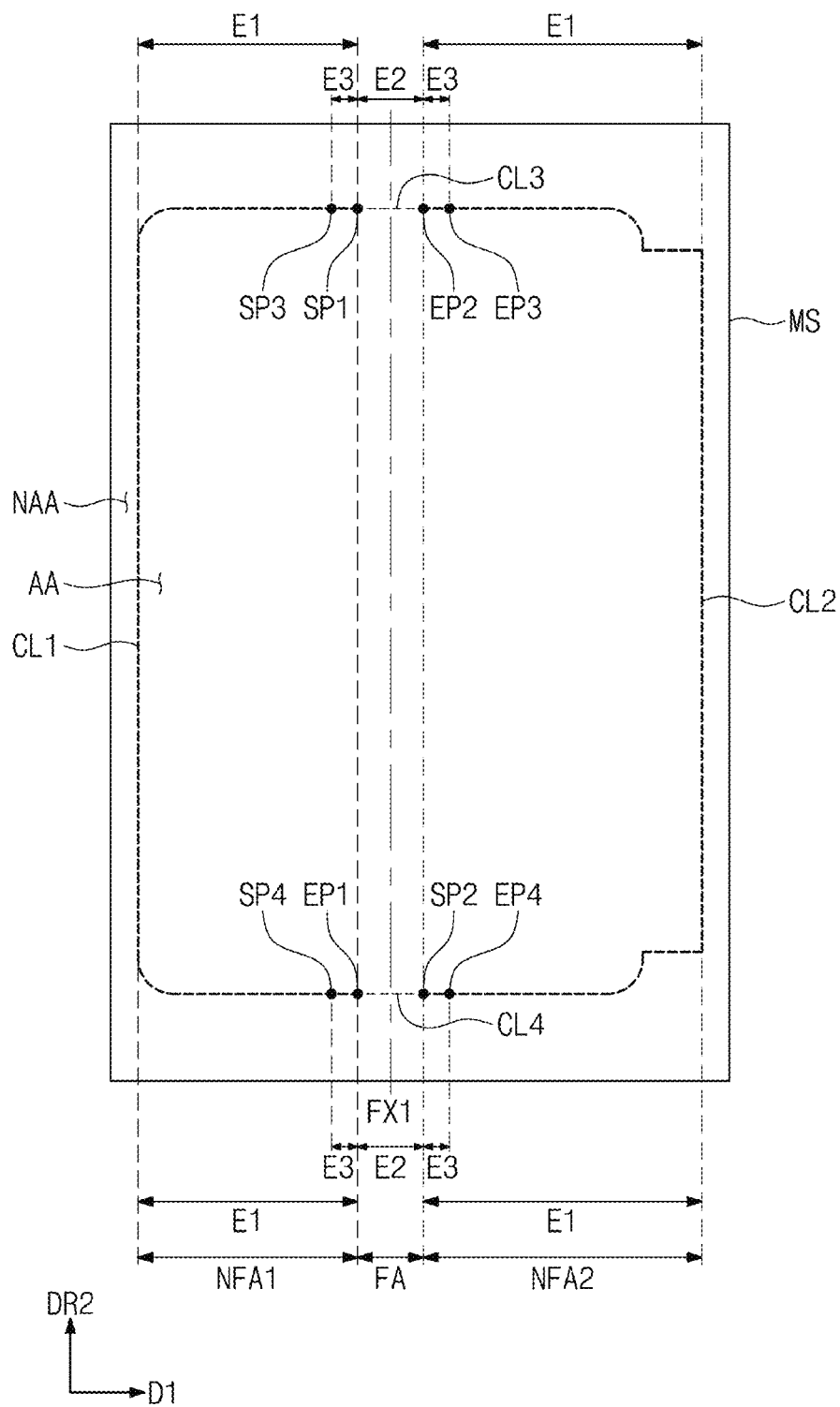
FIG. 9 is a view exemplarily illustrating first to fourth start points and first to fourth end points on a mother substrate of FIGS. 8A to 8D.

FIG. 9 is a view exemplarily illustrating the first to fourth start points and the first to fourth end points on the mother substrate of FIGS. 8A to 8D.

Referring to FIG. 9, the first start point SP1 and the first end point EP1 may be disposed at a boundary between the first non-folding area NFA1 and the folding area FA. The second start point SP2 and the second end point EP2 may be disposed at the boundary between the folding area FA and the second non-folding area NFA2. The third start point SP3 may be disposed on the first non-folding area NFA1, and the third end point EP3 may be disposed on the second non-folding area NFA2. The fourth start point SP4 may be disposed on the first non-folding area NFA1, and the fourth end point EP4 may be disposed on the second non-folding area NFA2.

More particularly, the first start point SP1 and the third start point SP3 are disposed on the first cutting line CL1 extending in the first direction DR1. The second end point EP2 and the third end point EP3 are disposed on the second cutting line CL2 extending in the first direction DR1. The fourth start point SP4 and the first end point EPT1 are disposed on the first cutting line CL1 extending in the first direction DR1. The second start point SP2 and the fourth end point EP4 are disposed on the second cutting line CL2 extending in the first direction DR1.

The first cutting line CL1 between the first start point SP1 and the first end point EP1 illustrated in FIG. 8A may be processed by the first laser device LD1 in the first laser process. In this case, the first laser device LD1 may have a first energy level E1.

The second cutting line CL2 between the second start point SP2 and the second end point EP2 illustrated in FIG. 8B may be processed by the first laser device LD1 in the second laser process. In this case, the first laser device LD1 may have the same first energy level E1 as the first laser process.

The third cutting line CL3 between the third start point SP3 and the third end point EP3 illustrated in FIG. 8C may be processed by the second laser device LD2 in the third laser process. Here, the second laser device LD2 between the third start point SP3 and the first start point SP1 in the third cutting line CL3 may have a third energy level E3.

Here, the second laser device LD2 between the first start point SP1 and the second end point EP2 in the third cutting line CL3 may have the second energy level E2. Also, in the third cutting line CL3, the second laser device LD2 between the second end point EP2 and the third end point EP3 may have the third energy level E3. That is, in the third laser process, the laser power of the second laser device LD2 is sequentially changed from the third energy level E3, to the second energy level E2, and back to the third energy level E3 along the first direction D1. The magnitudes of the first to third energy levels E1 to E3 may be expressed as follows: E1>E2>E3.

First end of the third cutting line CL3, e.g., a portion between the third start point SP3 and the first start point SP1 overlaps the first cutting line CL1, and the second end of the third cutting line CL3, e.g., a portion between the second end point EP2 to the third end point EP3 overlaps the second cutting line CL2. Thus, each of the laser processes may be performed two times.

Therefore, the laser processing may be performed at the lowest energy level E3 between the third start point SP3 and the first start point SP1 and between the second end point EP2 and the third end point EP3 to prevent excessive laser process.

If the third start point SP3 of the third laser process is the same as a point, at which the folding area FA starts, i.e., the first start point SP1, the stress applied to the second side surface WS2 (see FIG. 6) of the folding area FA may be increased, which may damage the side surface WS2. In an exemplary embodiment, the third start point SP3 may be set to any position on the first cutting line CL1 of the first non-folding area NFA1 to minimize the stress applied to the second side surface WS2 (see FIG. 6) of the folding area FA, thereby preventing or at least suppressing damage thereto during manufacture.

The fourth cutting line CL4 between the fourth start point SP4 and the fourth end point EP4 illustrated in FIG. 8D may be performed by the second laser device LD2 in the third laser process. Here, the second laser device LD2 between the fourth start point SP4 and the first end point EP1 in the fourth cutting line CL4 may have the third energy level E3.

Also, the second laser device LD2 between the first end point EP1 and the second start point SP2 in the fourth cutting line CL4 may have the second energy level E2. Also, the second laser device LD2 between the second start point SP2 and the fourth end point EP4 in the fourth cutting line CL4 may have the third energy level E3. That is, in the fourth laser process, the laser power of the second laser device LD2 is sequentially changed from the third energy level E3, to the second energy level E2, and back to the third energy level E3. The magnitudes of the first to third energy levels E1 to E3 may be expressed as follows: E1>E2>E3.

First end of the fourth cutting line CL4, e.g., a portion between the fourth start point SP4 and the first end point EP1 overlaps the first cutting line CL1, and the second end of the fourth cutting line CL4, e.g., a portion between the second start point SP2 to the fourth end point EP4 overlaps the second cutting line CL2. Thus, each of the laser processes may be performed two times.

Therefore, the laser processing may be performed at the lowest energy level E3 between the fourth start point SP4 and the first end point EP1 and between the second start point SP2 and the fourth end point EP4 to prevent excessive laser processing.

FIG. 10 is a view of a mother substrate according to another exemplary embodiment.

A mother substrate MS of FIG. 10 has a configuration similar to that of the mother substrate MS of FIG. 9. However, the mother substrate MS of FIG. 10 is different from the mother substrate MS of FIG. 9 with respect to positions of a third start point SP3 and a third end point EP3 of a third cutting line CL3 and positions of a fourth start point SP4 and a third end point EP3 of a fourth cutting line CL4.

More particularly, the third start point SP3 of the third cutting line CL3 and the fourth start point SP4 of the fourth cutting line CL4, which are illustrated in FIG. 10, may be disposed further away from the folding area FA in an opposite direction of the first direction DR1 when compared to those of FIG. 9. The third end point EP3 of the fourth cutting line CL4 and the fourth end point EP4 of the fourth cutting line CL4, which are illustrated in FIG. 10, may be disposed further away from the folding area FA in the first direction DR1 when compared to those of FIG. 9.

As described above, the positions of the third start point SP3 and the third end point EP3 of the third cutting line CL3, and the fourth start point SP4 and the third end point EP4 of the fourth cutting line CL4, may be disposed at any positions of the first cutting line CL1 and the second cutting line CL2 in the first direction D1.

The laser processing may be performed at the lowest energy level E3 between the third start point SP3 and the first start point SP1, and between the second end point EP2 and the third end point EP3, to prevent excessive laser processing. Also, the laser processing may be performed at the lowest energy level E3 between the fourth start point SP4 and the first end point EP1, and between the second start point SP2 and the fourth end point EP4, to prevent excessive laser processing.

FIGS. 11A to 11E are photographs illustrating side surfaces of a display substrate disposed on areas A1, A2, A3, A4, and A5 of FIG. 10.

FIGS. 11A to 11E illustrates a display substrate DD, on which the non-effective area NAA is removed, and only the effective area AA is provided after the first to fourth laser processes are performed as described above with reference to FIGS. 8A to 8D.

Figure 11A:
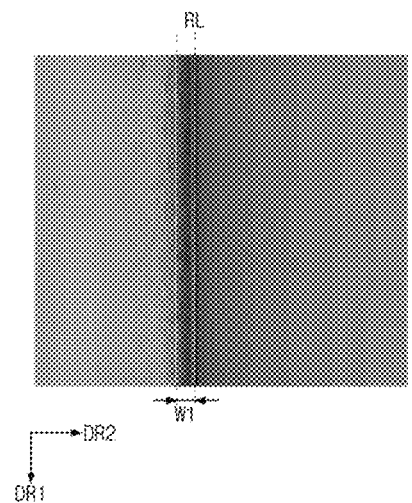
FIGS. 11A, 11B, 11C, 11D, and 11E are photographs illustrating side surfaces of a display substrate disposed on areas A1, A2, A3, A4, and A5 of FIG. 10.

Referring to FIG. 11A, in the first area A1 disposed on the first folding area NFA1, the side surface of the display substrate DS has a first width range W1 from a reference line RL. The first width range W1 is defined as a maximum value of a distance from the reference line RL to the side surface of the substrate DS in the second direction DR2. As illustrated in FIG. 11A, in the first area AA, the side surface of the display substrate DS is substantially parallel to the reference line RL.

Figure 11B:
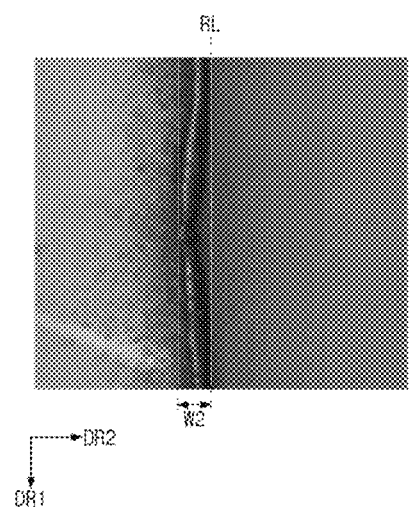

Referring to FIG. 11B, in a second area A2 disposed on the first folding area NFA1, the side surface of the display substrate DS has a second width range W2 from the reference line RL. The second width range W2 is defined as a maximum value of a distance from the reference line RL to the side surface of the substrate DS in the second direction DR2. In an exemplary embodiment, the second width range W2 is about 10.15 μm.

When comparing FIGS. 11A and 11B to each other, the second width range W2 on the second area A2 is greater than the first width range W1 on the first area A1. Since the laser process is performed two times, e.g., the first laser process and the third laser process are performed between the third start point SP3 and the first start point SP1, the laser process may be excessive to some extent. However, since the first non-folding area NFA1 is disposed between the third start point SP3 and the first start point SP1, even when the folding operation is repeated in the folding area FA of the completed display device DD (see FIGS. 2A to 2D), defects such as cracks may be prevented from occurring in the folding area FA.

Figure 11C:
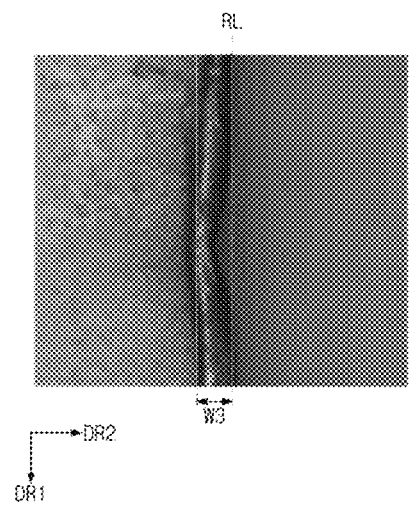

Referring to FIG. 11C, in a third area A3 disposed on the second folding area NFA2, the side surface of the display substrate DS has a third width range W3 from the reference line RL. The third width range W3 is defined as a maximum value of a distance from the reference line RL to the side surface of the substrate DS in the second direction DR2. In an exemplary embodiment, the third width range W3 is about 12.03 μm.

When comparing FIGS. 11A and 11C to each other, the third width range W3 on the third area A3 is greater than the first width range W1 on the first area A1. Since the laser process is performed two times, e.g., the second laser process and the third laser process are performed between the second end point EP2 and the third end point EP3, the laser process may be excessive to some extent. However, since the second non-folding area NFA2 is disposed between the second end point EP2 and the third end point EP3, even when the folding operation is repeated in the folding area FA of the completed display device DD (see FIGS. 2A to 2D), defects such as cracks may be prevented from occurring in the folding area FA.

Figure 11D:
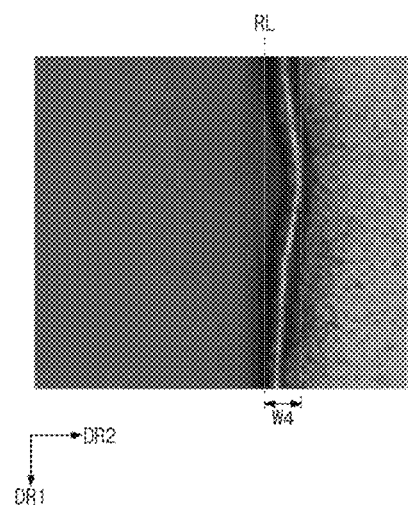

Referring to FIG. 11D, in a fourth area A4 disposed on the first folding area NFA1, the side surface of the display substrate DS has a fourth width range W4 from the reference line RL. The fourth width range W4 is defined as a maximum value of a distance from the reference line RL to the side surface of the substrate DS in the second direction DR2. In an exemplary embodiment, the fourth width range W4 is about 12.08 μm.

When comparing FIGS. 11A and 11D to each other, the fourth width range W4 on the fourth area A4 is greater than the first width range W1 on the first area A1. Since the laser process is performed two times, e.g., the first laser process and the fourth laser process are performed between the fourth start point SP4 and the first end point EP1, the laser process may be excessive to some extent. However, since the first non-folding area NFA1 is disposed between the fourth start point SP4 and the first end point EP1, even when the folding operation is repeated in the folding area FA of the completed display device DD (see FIGS. 2A to 2D), defects such as cracks may be prevented from occurring in the folding area FA.

Figure 11E:
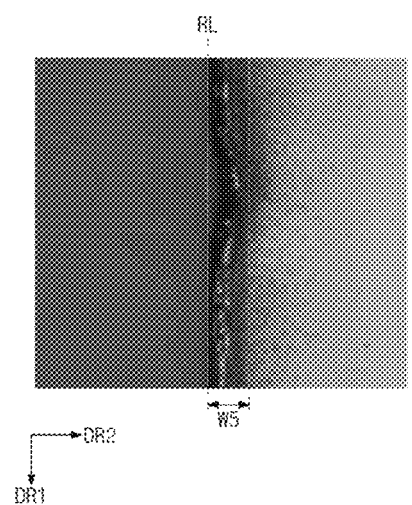

Referring to FIG. 11E, in a fifth area A5 disposed on the second folding area NFA2, the side surface of the display substrate DS has a fifth width range W5 from the reference line RL. The fifth width range W5 is defined as a maximum value of a distance from the reference line RL to the side surface of the substrate DS in the second direction DR2. In an exemplary embodiment, the fifth width range W5 is about 13.05 μm.

When comparing FIGS. 11A and 11E to each other, the fifth width range W5 on the fifth area A5 is greater than the first width range W1 on the first area A1. Since the laser process is performed two times, e.g., the second laser process and the fourth laser process are performed between the second start point SP2 and the fourth end point EP4, the laser process may be excessive to some extent. However, since the second non-folding area NFA2 is disposed between the second start point SP2 and the fourth end point EP4, even when the folding operation is repeated in the folding area FA of the completed display device DD (see FIGS. 2A to 2D), defects such as cracks may be prevented from occurring in the folding area FA.

In the display device having such the configuration, when the laser process of cutting the display substrate is performed, the laser process may be performed on the cutting line disposed on the folding area by using the low-energy laser, unlike in the non-folding area.

As such, the stress applied to the side surface and the damage of the side surface of the folding area may be reduced during the cutting process. As a result, the defects on the folding area may be reduced to improve the product reliability of the foldable display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel configured to display an image and including a folding area configured to be folded along a virtual folding axis and a non-folding area adjacent to a side of the folding area; and
   a window disposed on the display panel and comprising a soft material, such that the window is configured to be folded along with the display panel,
   wherein:
   the non-folding area includes a first area and a second area sequentially disposed in a first direction, the second area being disposed adjacent to the folding area; and
   a portion of a side surface of the window disposed in the first area has a first width range from a reference line parallel to the first direction and a portion of the side surface of the window disposed in the second area has a second width range different from the first width range from the reference line.

2. The display device of claim 1, wherein the second width range is greater than the first width range.

3. The display device of claim 1, wherein the window comprises a base layer, a window functional layer disposed on the base layer, and a window protection layer covering the window functional layer.

4. The display device of claim 3, wherein the side surface of the window comprises a side surface of the base layer, a side surface of the window functional layer, and a side surface of the window protection layer.

5. The display device of claim 1, wherein a portion of the side surface of the window in the non-folding area has a first surface roughness and a portion of the side surface of the window in the folding area has a second surface roughness less than the first surface roughness.

6. The display device of claim 1, further comprising a functional layer disposed between the display panel and the window.

7. The display device of claim 1, further comprising a protection film disposed on a rear surface of the display panel.

8. A method for manufacturing a display device comprising: a display panel having a folding area configured to be folded along a virtual folding axis and first and second non-folding areas adjacent to both sides of the folding area; and a window disposed on the display panel and configured to be folded along with the display panel, the method comprising:
   preparing a mother substrate having an effective area and a non-effective area divided by a cutting line as a boundary;
   performing a first laser process along a first cutting line of the cutting line disposed in the first non-folding area;
   performing a second laser process along a second cutting line of the cutting line disposed in the second non-folding area; and
   performing a third laser process along a third cutting line of the cutting line disposed in the folding area,
   wherein:
   a first end of the third cutting line overlaps a first end of the first cutting line; and
   is a second end of the third cutting line overlaps a first end of the second cutting line.

9. The method of claim 8, wherein the third laser process is performed by irradiating a second laser beam having an energy less than that of a first laser beam used in the first laser process.

10. The method of claim 9, wherein:
    the first laser beam is irradiated at a first rate in the first laser process; and
    the second laser beam is irradiated at a second rate greater than the first rate in the third laser process.

11. The method of claim 9, wherein the second laser process is performed by irradiating the first laser beam.

12. The method of claim 8, wherein:
    the first cutting line includes a first start point and a first end point;
    the second cutting line includes a second start point and a second end point; and
    the third cutting line includes a third start point and a third end point.

13. The method of claim 12, wherein:
    the third start point of the third cutting line is disposed on the first cutting line; and
    the third end point of the third cutting line is disposed on the second cutting line.

14. The method of claim 13, wherein the third laser process starts at the third start point of the third cutting line and ends at the third end point of the third cutting line while passing through the first start point of the first cutting line and the second end point of the second cutting line.

15. The method of claim 14, wherein:
    each of the first laser process and the second laser process is performed by irradiating a first laser beam having a first energy level;
    the third laser process comprises:
       a first sub-laser process of irradiating a second laser beam having a third energy level from the third start point of the third cutting line to the first start point of the first cutting line;
       a second sub-laser process of irradiating the second laser beam having the third energy level from the first start point of the first cutting line to the second end point of the second cutting line; and
       a third sub-laser process of irradiating the second laser beam having a second energy level from the second end point of the second cutting line to the third end point of the third cutting line; and
    the first energy level, the second energy level, and the third energy level have laser power is different from each other.

16. The method of claim 15, wherein:
the first energy level is greater than the second energy level; and
the second energy level is greater than the third energy level.

17. The method of claim 8, further comprising performing a fourth laser process along a fourth cutting line of the cutting line disposed in the folding area,
wherein:
a first end of the fourth cutting line overlaps a second end of the first cutting line; and
a second end of the fourth cutting line overlaps a second end of the second cutting line.

18. The method of claim 17, wherein:
a fourth start point of the fourth cutting line is disposed on the first cutting line; and
a fourth end point of the fourth cutting line is disposed on the fourth cutting line.

19. The method of claim 18, wherein:
each of the first laser process and the second laser process is performed by irradiating a first laser beam having a first energy level; and
the fourth laser process is performed by irradiating a second laser beam having energy less than that of the first laser beam.

20. The method of claim 17, wherein:
the first to fourth cutting lines form a closed curve shape that surrounds the effective area; and
the non-effective area of the mother substrate is removed after the first to fourth laser processes are performed along the first to fourth cutting lines.

* * * * *